United States Patent [19]

Pinckley

[11] Patent Number: 5,146,504
[45] Date of Patent: Sep. 8, 1992

[54] SPEECH SELECTIVE AUTOMATIC GAIN CONTROL

[75] Inventor: Danny T. Pinckley, Arlington, Tex.

[73] Assignee: Motorola, Inc., Schaumburg, Ill.

[21] Appl. No.: 623,481

[22] Filed: Dec. 7, 1990

[51] Int. Cl.$^5$ ............................................. G10L 3/02
[52] U.S. Cl. ..................................... 381/46; 381/47;
381/104; 395/2
[58] Field of Search ....................... 381/29–35,
381/41, 43, 46, 47, 48, 68.4, 104; 395/2

[56] References Cited

U.S. PATENT DOCUMENTS

| | | | |
|---|---|---|---|
| 4,380,824 | 4/1983 | Inoue | 381/47 |
| 4,737,976 | 4/1988 | Borth et al. | 381/46 |
| 5,012,519 | 4/1991 | Adlersberg et al. | 381/47 |

Primary Examiner—Dale M. Shaw
Assistant Examiner—David D. Knepper
Attorney, Agent, or Firm—Michael J. Buchenhorner

[57] ABSTRACT

An automatic gain control circuit uses a speech recognizer to obtain smooth automatic gain control. An analog audio input signal is converted to a digital signal by an analog-to-digital converter and delayed by a delay circuit. A frame power (or alternatively, rectified peak amplitude) detector determines the power of each frame (or alternatively, the rectified peak amplitude) of the audio input signal, after applied to the A/D converter. A linear-to-log converter converts those values to a logarithmic form (for gain control over a broad range of values). A detected speech smoothing circuit smooths the variation in the values determined by the frame power (or peak amplitude) detector. A summer subtracts the output of the detected speech smoothing means from a fixed reference level, and thus obtains an error signal from the desired reference. A gain smoothing circuit smooths the resulting error signal (which is the logarithmically-shaped gain signal). A logarithm-to-linear converter converts the logarithmic gain signal to a linear form; and a multiplier multiplies the input signal by this smoothed gain. In accordance with the invention, a speech recognizer determines whether the audio input signal represents speech. An output of the speech recognizer is used to enable the detected speech smoothing circuit and the gain smoothing means when the audio input signal represents speech. Thus AGC is not used until it is required (i.e., when speech is present).

18 Claims, 3 Drawing Sheets

SPEECH SELECTIVE AUTOMATIC GAIN CONTROL

TECHNICAL FIELD

This invention relates generally to automatic gain control, and more specifically, to automatic gain control with speech recognition.

BACKGROUND

Automatic gain control (AGC) of speech signals is used to maintain the level of a signal representing speech relatively constant. Most existing circuits designed for automatic gain control of speech suffer from at least one of the following problems (1) they respond slower than necessary to changes in the average amplitude of the speech, (2) they sound unnatural due to allowing the speech amplitude to adapt too quickly, or (3) they allow extraneous sounds to be subject to AGC also. Most of those circuits respond slower than necessary because they use all available information present at the input of the AGC. Therefore, they must use very long time constants for smoothing because of the highly variable nature of the amplitudes of the signals (speech, noise, and silent passages are all included in the input information). Improvements have been made in other AGCs by processing only the largest amplitude signals within a given range of the expected signal, where the expected signal was derived from ongoing information. With this approach, if no information is received within the expected range, the estimate of the expected signal would be gradually lowered until information is again received within the expected range. In order to make the AGC sound natural, the process of changing the expected range of information must occur fairly slowly to prevent performing AGC on low amplitudes of information that occur in normal speech. Some AGCs process only information that contains components in a particular frequency band, in which it is assumed that most of the information will be speech. That approach has obvious shortcomings because many sounds that are not speech have components in the speech range and also because there could be a very large variation in the amplitudes of the speech within the particular frequency band (in that both voiced and unvoiced sounds may meet the criteria). Thus, a need exists for an AGC circuit that allows a faster AGC response time with natural sounding speech, and will not increase the gain on non-speech background noise during pauses or when the user is in a high noise environment.

SUMMARY OF THE INVENTION

Briefly, according to the invention, an automatic gain control circuit comprises a speech recognizer to obtain smooth automatic gain control. An analog audio input signal is converted to a digital signal input by an analog-to-digital (A/D) converter and delayed by delay means. A frame power (or alternatively, rectified peak amplitude) detector determines the power of each frame (or alternatively, the rectified peak amplitude) of the audio input signal, after applied to the A/D converter. A linear-to-log converter converts those values to a logarithmic form (for gain control over a broad range of values). Detected speech smoothing means smooths the variation in the values determined by the frame power (or peak amplitude) detector. A summer subtracts the output of the detected speech smoothing means from a fixed reference level, and thus obtains an error signal from the desired reference. A gain smoothing circuit smooths the resulting error signal (which is the logarithmically-shaped gain signal). A logarithm-to-linear converter converts the logarithmic gain signal to a linear form; and a multiplier multiplies the digital input signal by this smoothed gain. In accordance with the invention, a speech recognizer determines whether the audio input signal represents speech in terms of known recognizable words or sounds. An output of the speech recognizer is used to enable the detected speech smoothing means and the gain smoothing means when the audio input signal represents speech. Thus AGC is not used until it is required (i.e., when speech is present).

DETAILED DESCRIPTION OF THE PREFERRED EMBODIMENT

Figure 1:
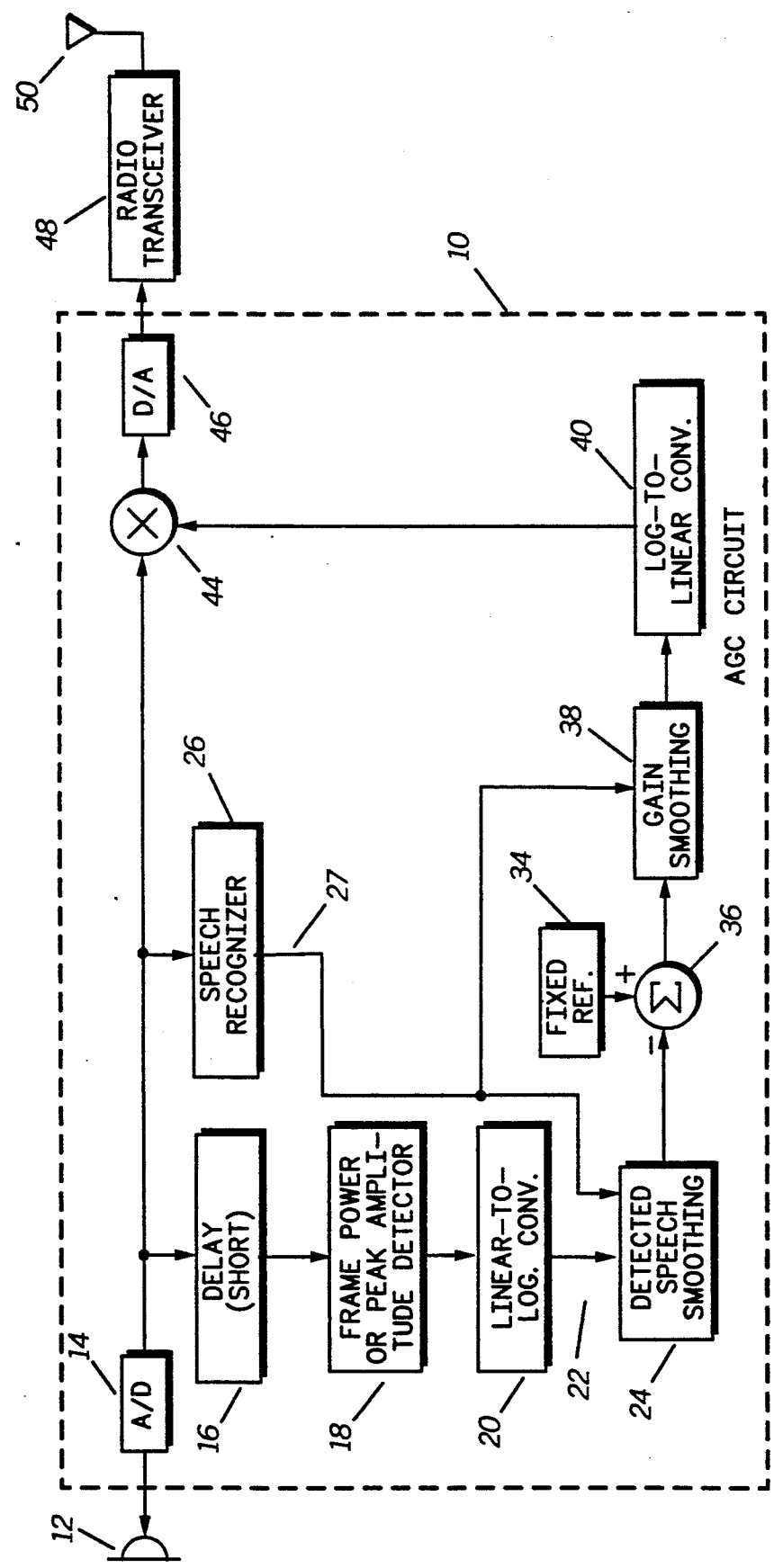
FIG. 1 shows an AGC circuit in accordance with the invention.

Referring to FIG. 1, there is shown an automatic gain control (AGC) circuit 10 to be used with a radio transceiver 48 in accordance with the invention. The AGC circuit 10 functions as a "smart" automatic gain control for speech systems. Preferably, the AGC circuit 10 is used at a microphone input in a land mobile or cellular radio, base station, or portable radio (any of which is represented by the transceiver 48), or at the input of a repeater, but it could be used in any environment requiring automatic gain control of speech, such as in a hands-free mobile radio application.

In the embodiment of FIG. 1 all the processing of the AGC circuit 10 may be done inside a conventional digital signal processor (DSP), except possibly, the analog-to-digital (A/D) and digital-to-analog (D/A) functions. However, it will be appreciated that each of the functions of the AGC circuit 10 may also be performed with circuits or other means corresponding to the blocks in the AGC circuit 10. Operationally, an audio input signal is received at a microphone 12. An A/D converter 14 converts the audio input signal into a digital input signal. The digital input signal is delayed for a short period of time (e.g., tens of milliseconds) by a delay circuit 16 (e.g., a speech buffer). A frame power (or peak amplitude) detector 18 determines the power of each frame (or rectified peak amplitude) of the audio input signal, after it is applied to the A/D converter 14. The linear-to-logarithm converter 20 converts those values to a logarithmic form (for gain control over a broad range of values). Detected speech smoothing means 24 (e.g., a low-pass filter) smooths the variation in the values determined by the frame power (or peak amplitude) detector 18. A summer 36 subtracts the output of the detected speech smoothing means 24 from a fixed reference level, and thus obtains an error signal from the desired reference. The gain smoothing circuit 38 smooths the resulting error signal (which is a logarithmically-shaped gain signal). A logarithm-to-linear converter 40 converts the logarithmic gain signal to a linear form; and a multiplier 44 multiplies the input signal by this smoothed gain signal, thus resulting in gain control. In accordance with the invention, a speech recognizer 226 determines whether at least a portion of the digital input signal represents any of a set of words that it is programmed to recognize (i.e., recognizable speech). The speech recognizer 26 can be the SPHINX System described in "Large-Vocabulary Speaker-Independent Continuous Speech Recognition: The SPHINX System" Computer Science Department Carnegie Mellon University (1988), hereby incorporated by reference. A speech detect output 27 of the speech recognizer 26 is used to enable the detected speech smoothing means 24 and the gain smoothing means 38 when the digital input signal represents recognizable speech. Thus AGC is not used until required (i.e., when reconizable speech is present). Specifically, when the speech detect output 27 first goes from false (i.e., no speech is detected) to true (i.e., speech is detected), the output of the detected speech smoothing means 24 is initialized to the level currently at its input. The detected speech smoothing means 24 then smooths, as any typical low-pass filter would while the speech detect output 27 is true. Also, the gain smoothing only changes when the speech detect output 27 is true. When the speech detect output 27 is false, the gain smoothing output maintains its previous output value without responding to changes in its input. This allows the AGC's control to respond only to the portions of the input signal that are truly speech.

In an alternate implementation of the operation of the detected speech smoothing means 24 and the gain smoothing means 38, the detected speech smoothing means 24 can perform an average of its input values during only the time the speech detect output 27 is true. The output of detected speech smoothing means 24 would then be applied to summer 36 at the transition of the speech detect output 27, changing from a true to a false state. The output of detected speech smoothing means 24 to summer 36 results in a new output value to the input of gain smoothing means 38. The gain smoothing calculation would then be made based on the new value from the summer 36. The latter implementation differs from the one discussed previously in that there is only one change in each of the outputs of detected speech smoothing means 24, summer 36, and gain smoothing 38 for each speech portion that is detected.

The output of the multiplier 44 is converted to analog form by a D/A converter 46. The resulting amplified analog signal is then applied to a conventional radio transceiver 48 for transmission via an antenna 50.

Figure 2:
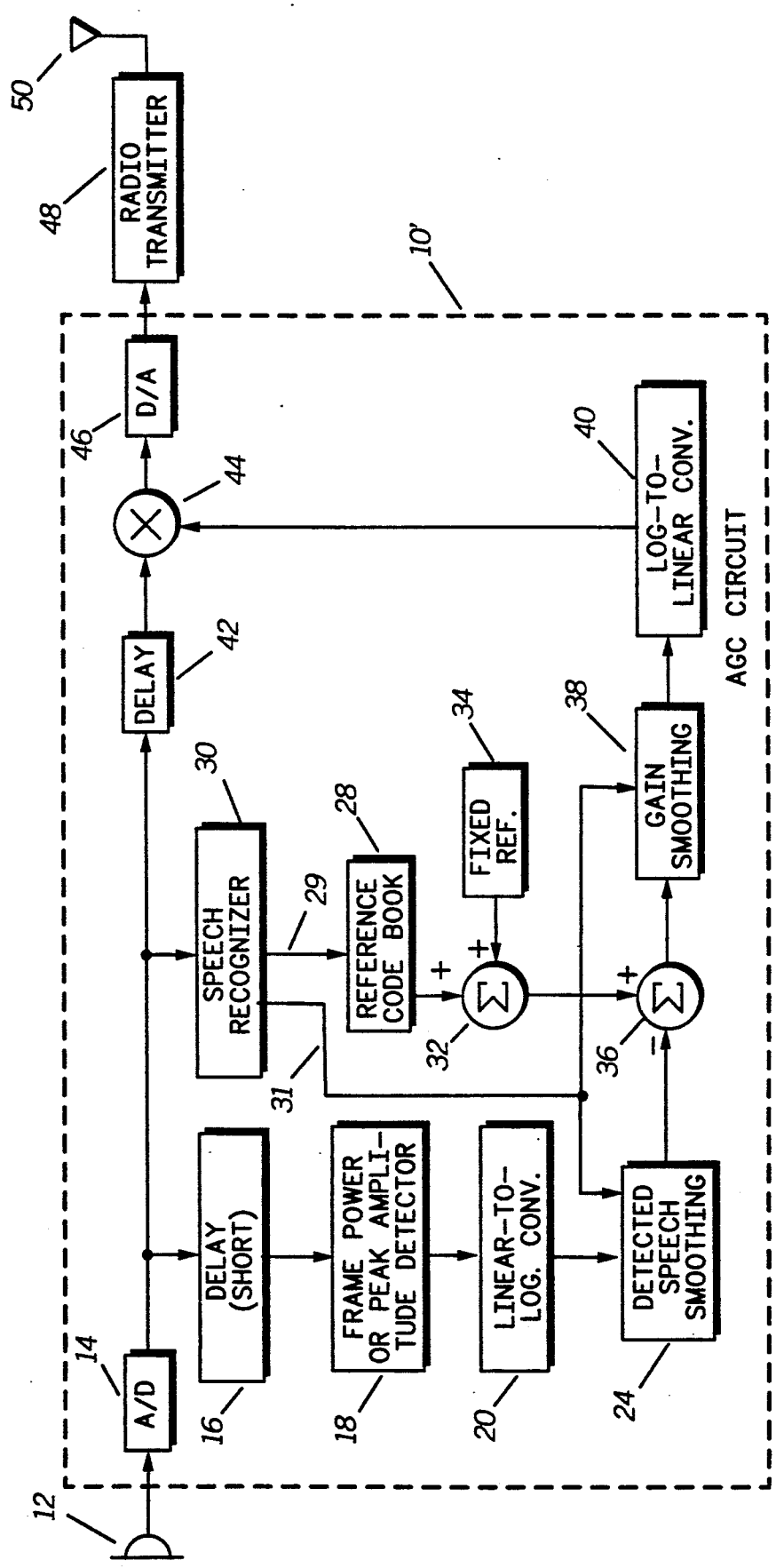
FIG. 2 shows another AGC circuit in accordance with the invention.

Referring to FIG. 2, an AGC circuit 10' similar to the AGC circuit 10 is shown. The AGC circuit 10' also includes a speech (or keyword) recognizer 30 which, in this embodiment, processes the incoming speech (after converted to digital form) to detect and discern one of a set of commonly occurring sounds or keywords. These sounds or keywords may be stored in a reference codebook 28 (e.g., a memory look-up table). The information stored in the reference codebook 28 could be a set of the ten, or so, most common vowel sounds or a set of any of the most commonly occurring words like "a", "an", "the", "of", etc., or some combination of these sets or others (hereafter called keywords). The specific method of recognition may be selected. The requirements on the recognition method are that it can distinguish these keywords in a continuous speech environment with a fairly low instance of substitution error (i.e., incorrectly classifying keywords within the desired set). It can be allowed to have a fairly large deletion error rate (i.e., failing to recognize keywords within the desired set), so its parameters can be adjusted to insure that it does not make insertion errors (i.e., recognizing keywords that are not in the desired set) at the expense deletion errors.

There are two outputs, 31 and 29, of the speech recognizer 30. The keyword detect output 31 simply indicates the presence or absence of a valid keyword in the input signal, and enables the detected speech smoothing means 24 and the gain smoothing means 38 when such a valid keyword is detected. It is also timed such that this output indication will be present during the peak power (or peak amplitude) part of the keyword. Output 29 provides the keyword. When the reference codebook 28 receives a keyword, it provides an output signal to a summer 32 so that the output signal of the reference codebook 28 is added to a reference level provided by the fixed reference source 34. The summer 32 then provides a keyword reference to the summer 36 for summing with the output of the detected speech smoothing filter 24. The circuit 10' works in a manner similar to the AGC circuit 10 to provide AGC when a keyword is detected in the input signal.

The keyword detect output 31 of speech recognizer 30 is used to enable the detected speech smoothing means 24 and the gain smoothing means 38 in a manner similar to that described with respect to circuit 10. This allows the AGC circuit's gain control section to respond only to the portions of the input signal that are truly speech while limiting the set of speech signals to which it responds to be a small, known, frequently occurring subset of the possible speech signals actually applied to its input.

A delay circuit 42 introduces a delay in the input audio signal before that signal is multiplied with the linear gain signal. This allows the gain to be applied to earlier speech samples, to minimize the effect of the time delay that is required to process the speech in the speech recognizer 30. This reduces the apparent response time to changes in the input signal amplitude.

Figure 3:
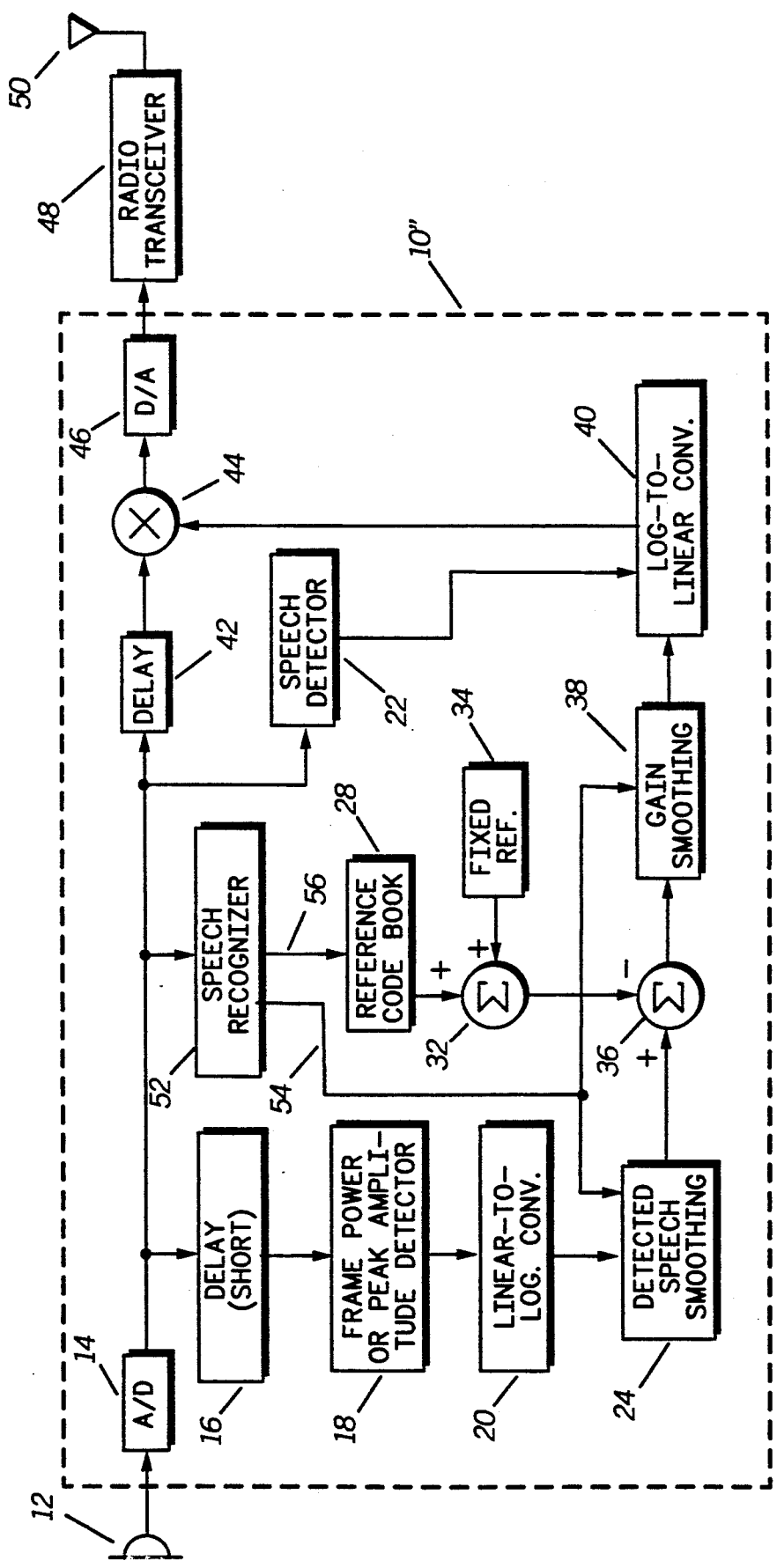
FIG. 3 shows still another AGC circuit in accordance with the invention.

Referring to FIG. 3, there is shown an AGC circuit 10" representing the AGC circuit 10' modified to include a speech detector 22 for detecting the presence of speech-like components (e.g., based on power above background noise or other known speech detection techniques), for disabling the log-to-linear converter 40 when any speech is detected in the input signal. In this configuration, the changes in the gain that were calculated during the recognized speech are not applied to the multiplier during the time that the input signal represents speech, but the changes are made between words to make the transition in gain less noticeable. A speech recognizer 52 can operate as either speech recognizer 26 or 30 (or both). The speech recognizer 52 has output 54 for enabling the detected speech smoothing means 24 and the gain smoothing means 38 in a manner similar to that of circuits 10 and 10'. The output 56 is similar to output 29 of FIG. 2. The speech detector 22 function may be incorporated into the speech recognizer 52.

What is claimed is:
1. A communication device including an automatic gain control circuit comprising:
an analog-to-digital converter, coupled to a source of analog audio signals, for producing a digital input signal representing the analog audio signal;
first delay means, coupled to the analog-to-digital converter for delaying the digital input signal provided by the analog-to-digital converter;

power detector means, coupled to the first delay means, for detecting the power level of the digital input signal, and for producing a linear power signal representing the power level of the digital signal;

a linear-to-logarithmic converter, coupled to the power detector means, for converting the linear power signal into a logarithmic power signal;

speech smoothing means, coupled to the linear-to-logarithmic converter, for smoothing the logarithmic power signal to provide a smoothed logarithmic power signal;

a first summer for substracting the smoothed logarithmic power signal from a reference signal to provide a logarithmic error signal representing a logarithmic gain signal;

gain smoothing means, coupled to the summer, for smoothing the logarithmic gain signal to provide a smoothed logarithmic gain signal;

a logarithmic-to-linear converter, coupled to the gain smoothing means, for converting the smoothed logarithmic gain signal to a smoothed linear gain signal;

a multiplier for multiplying the smoothed linear gain signal with the digital input signal to provide an amplified digital input signal; and a speech recognizer, coupled to the analog-to-digital converter, for determining whether the digital input signal represents recognizable speech, and for enabling the detected speech smoothing means and the gain smoothing means, when speech is detected in the input signal.

2. The communication device of claim 1 further comprising delay means, coupled to the analog-to-digital converter, for delaying the digital input signal before the digital input signal is multiplied with the smoothed linear gain signal.

3. The communication device of claim 1 wherein the speech recognizer determines whether the digital input signal represents at least one predetermined keyword, and the automatic gain control circuit further comprises:

reference memory means, coupled to the speech recognizer, for storing a plurality of predetermined keywords, and having an output for providing a relative power level value corresponding to a detected keyword when the speech recognizer determines that the digital input signal represents the detected keyword;

a second summer for summing the relative power level value with a fixed reference to provide the reference signal.

4. The communication device of claim 3, wherein the automatic gain control circuit further comprises a source of the fixed reference.

5. The communication device of claim 4, wherein the automatic gain control circuit further comprises a speech detector for determining whether the digital input signal represents speech, and for enabling the logarithm-to-linear converter to change state when the digital input signal does not represent recognizable speech.

6. The communication device of claim 5, further comprising a radio transceiver, coupled to the multiplier.

7. The communication device of claim 6, further comprising a digital-to analog converter, disposed between the multiplier and the radio transceiver, for converting the amplified digital input signal to analog form.

8. A communication device including an automatic gain control circuit comprising:

an analog-to digital converter coupled to a source of analog audio signals to produce a digital input signal representing the analog audio signal;

first delay means, coupled to the analog-to-digital converter for delaying the digital signal provided by the analog-to-digital converter;

peak amplitude detector means, coupled to the first delay means, for detecting the peak amplitude level of the digital input signal, and for producing a linear peak amplitude signal representing the peak amplitude level of the digital signal;

a linear-to-logarithmic converter, coupled to the peak amplitude detector means, for converting the linear peak amplitude signal into a logarithmic peak amplitude signal;

speech smoothing means, coupled to the linear-to-logarithmic converter, for smoothing the logarithmic peak amplitude signal to provide a smoothed logarithmic peak amplitude signal;

a first summer for subtracting the smoothed logarithmic peak amplitude signal from a reference signal to provide a logarithmic error signal representing a logarithmic gain signal;

gain smoothing means, coupled to the summer, for smoothing the logarithmic gain signal to provide a smoothed logarithmic gain signal;

a logarithmic-to-linear converter, coupled to the gain smoothing means, for converting the smoothed logarithmic gain signal to a smoothed linear gain signal;

a multiplier for multiplying the smoothed linear gain signal with the digital input signal to provide an amplified digital input signal; and a speech recognizer, coupled to the analog-to-digital converter, for determining whether the digital input signal represents recognizable speech, and for enabling the detected speech smoothing means and the gain smoothing means, when speech is detected in the input signal.

9. The communication device of claim 8 further comprising delay means, coupled to the analog-to-digital converter, for delaying the digital input signal before the digital input signal is multiplied with the smoothed linear gain signal.

10. The communication device of claim 8 wherein the speech recognizer determines whether the digital input signal represents at least one predetermined keyword, and the automatic gain control circuit further comprises:

reference memory means, coupled to the speech recognizer, for storing a plurality of predetermined keywords, and having an output for providing a logarithmic relative peak amplitude corresponding to a detected keyword when the speech recognizer determines that the digital input signal represents the detected keyword;

a second summer for summing the relative peak amplitude with a fixed reference to provide the reference signal.

11. The communication device of claim 10, wherein the automatic gain control circuit further comprises a source of the fixed reference.

12. The communication device of claim 11, wherein the automatic gain control circuit further comprises a speech detector for determining whether the digital input signal represents speech, and for enabling the logarithm-to-linear converter to change state when the digital input signal does not represent recognizable speech.

13. The communication device of claim 12, further comprising a radio transceiver, coupled to the multiplier.

14. The communication device of claim 13, further comprising a digital-to analog converter, disposed between the multiplier and the radio transceiver, for converting the amplified digital input signal to analog form.

15. A method for automatically controlling gain in a communication device comprising the steps of:
   receiving an input signal;
   converting the input signal to digital form to provide a digital input signal;
   determining whether at least a portion of the digital input signal represents recognizable speech;
   delaying the digital input signal to allow time to recognize at least a portion of the digital input signal as speech;
   measuring the power level of at least a portion of the delayed digital input signal to provide a power signal representing the power level of the portion of the digital input signal;
   converting the power signal to logarithmic form, to provide a logarithmic power signal;
   smoothing the logarithmic power signal, to provide a smooth logarithmic power signal, when at least a portion of the digital input signal represents recognizable speech;
   subtracting the smooth logarithmic power signal from a reference signal, to provide a logarithmic gain error signal;
   smoothing the logarithmic gain error signal, to produce a smooth logarithmic gain error signal, when at least a portion of the digital input signal represents speech;
   converting the smooth logarithmic gain error signal to linear form to provide a linear gain signal; and
   multiplying the digital input signal with the linear gain signal to provide an amplified output signal.

16. The method for automatically controlling gain in a communication device of claim 15 further comprising the step of:
   delaying the digital input signal before multiplying the digital input signal with the smoothed linear gain signal.

17. A method for automatically controlling gain in a communication device comprising the steps of:
   receiving an input signal;
   converting the input signal to digital form to provide a digital input signal;
   determining whether at least a portion of the digital input signal represents recognizable speech;
   delaying the digital input signal to allow time to recognize at least a portion of the digital input signal as speech;
   measuring the peak amplitude level of at least a portion of the digital input signal to provide a peak amplitude signal representing the peak amplitude level of the portion of the digital input signal;
   converting the peak amplitude signal to logarithmic form, to provide a logarithmic peak amplitude signal;
   smoothing the logarithmic peak amplitude signal, to provide a smooth logarithmic peak amplitude signal, when at least a portion of the digital input signal represents recognizable speech;
   subtracting the smooth logarithmic peak amplitude signal from a reference signal, to provide a logarithmic gain error signal;
   smoothing the logarithmic gain error signal, to produce a smooth logarithmic gain error signal, when at least a portion of the digital input signal represents recognizable speech;
   converting the smooth logarithmic gain error signal to linear form to provide a linear gain signal; and
   multiplying the digital input signal with the linear gain signal to provide an amplified output signal.

18. The method for automatically controlling gain in a communication device of claim 17 further comprising the step of:
   delaying the digital input signal before multiplying the digital input signal with the smoothed linear gain signal.

* * * * *